United States Patent
Kim et al.

(10) Patent No.: US 9,837,634 B2
(45) Date of Patent: Dec. 5, 2017

(54) ELECTRONIC DEVICE DISPLAY WITH MULTI-LAYER FLEXIBLE ENCAPSULATION

(71) Applicant: Apple Inc., Cupertino, CA (US)

(72) Inventors: Jinkwang Kim, Tokyo (JP); Jungmin Lee, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/152,343

(22) Filed: May 11, 2016

(65) Prior Publication Data

US 2017/0025640 A1 Jan. 26, 2017

Related U.S. Application Data

(60) Provisional application No. 62/194,625, filed on Jul. 20, 2015.

(51) Int. Cl.
*H01L 29/08* (2006.01)
*H01L 21/00* (2006.01)
*H01L 51/52* (2006.01)
*H01L 23/00* (2006.01)
*H01L 27/32* (2006.01)
(Continued)

(52) U.S. Cl.
CPC ........ *H01L 51/5256* (2013.01); *H01L 23/562* (2013.01); *H01L 51/0097* (2013.01); *H01L 51/5253* (2013.01); *H01L 23/53295* (2013.01); *H01L 27/3244* (2013.01); *H01L 27/3262* (2013.01); *H01L 51/0034* (2013.01); *H01L 2251/5338* (2013.01)

(58) Field of Classification Search
CPC ............. H01L 51/5256; H01L 27/3244; H01L 27/3262; H01L 25/167; H01L 27/3202; H01L 51/5253; H01L 51/0097; H01L 51/0034; H01L 23/53295; H01L 23/562
See application file for complete search history.

(56) References Cited

U.S. PATENT DOCUMENTS 7,508,130 B2 3/2009 Cok
8,343,802 B2 1/2013 Reynolds et al.
(Continued)

OTHER PUBLICATIONS

Li et al., Thin Film Encapsulation of OLED Displays with Organic-Inorganic Composite Film, IEEE, 2008 Electric Components and Technology Conference, Mar. 29, 2008, pp. 1819-1824.

*Primary Examiner* — Alonzo Chambliss
(74) *Attorney, Agent, or Firm* — Treyz Law Group, P.C.; G. Victor Treyz; Tianyi He (57) ABSTRACT

A flexible display encapsulation layer may be used to encapsulate and protect organic light-emitting diodes and a thin-film transistor layer on a flexible display. The flexible encapsulation layer may include a lateral dispersion layer that exhibits an anisotropic moisture diffusion characteristic. Lateral diffusion in the lateral dispersion layer is larger than vertical dispersion in a direction that runs perpendicular to the display. An inorganic conformal coating layer may cover the lateral diffusion layer and may serve as a pinhole filling layer. The pinhole filling layer may be covered with a moisture barrier layer that serves to prevent moisture from penetrating the display. A polymer protective layer may cover the moisture barrier layer and may be relatively insensitive to bending induced stress as the display is flexed.

19 Claims, 8 Drawing Sheets

(51) Int. Cl.
    *H01L 51/00*      (2006.01)
    *H01L 23/532*     (2006.01)

(56)          References Cited

U.S. PATENT DOCUMENTS 8,373,343  B2      2/2013   Michels et al.
    8,696,134  B2 *    4/2014   Murakawa ........... G02B 5/3008
                                                          353/20
 2009/0278454  A1     11/2009   Fedorovskaya et al.
 2011/0193067  A1 *   8/2011    Lee .................... H01L 51/5256
                                                          257/40
 2011/0212304  A1 *   9/2011    Han ...................... H05B 33/04
                                                          428/172
 2012/0146492  A1 *   6/2012    Ryu .................... H01L 51/5256
                                                          313/512
 2013/0002133  A1      1/2013   Jin et al.
 2013/0002572  A1      1/2013   Jin et al.
 2013/0334511  A1 *  12/2013    Savas ...................... H01L 51/56
                                                          257/40
 2014/0167006  A1 *   6/2014    Kim .................... H01L 27/3244
                                                          257/40
 2014/0319493  A1 *  10/2014    Lee .................... H01L 29/78603
                                                          257/40
 2015/0084012  A1      3/2015   Kim et al.
 2015/0115235  A1      4/2015   Lee et al.
 2015/0333293  A1 *  11/2015    Poon ................... H01L 51/5253
                                                          257/40
 2015/0357387  A1 *  12/2015    Lee .................... H01L 51/0097
                                                          257/40
 2016/0014881  A1 *   1/2016    Shin ....................... G09F 9/301
                                                          361/749
 2017/0005292  A1 *   1/2017    Lee .................... H01L 51/5256

* cited by examiner

ELECTRONIC DEVICE DISPLAY WITH MULTI-LAYER FLEXIBLE ENCAPSULATION

This application claims the benefit of provisional patent application No. 62/194,625, filed Jul. 20, 2015, which is hereby incorporated by reference herein in its entirety.

BACKGROUND

This relates generally to electronic devices, and, more particularly, to electronic devices with displays.

Electronic devices often include displays for presenting image to a user. Displays are typically formed from rigid planar substrates. Although satisfactory in many situations, rigid displays such as these may be difficult to integrated into certain devices, such as devices with bendable housings. A flexible display would accommodate a bendable housing.

Challenges arise, however, in forming satisfactory flexible displays. Displays such as organic light-emitting diode displays include encapsulation layers to protect sensitive display components. If care is not taken, encapsulation layers may become damaged when flexed.

It would therefore be desirable to be able to provide improved flexible displays for electronic devices.

SUMMARY

An electronic device may have flexible display. The flexible display may bend about a bend axis when portions of a housing for the electronic device rotate with respect to each other. The flexible display may have a flexible substrate layer, a thin-film transistor layer on the flexible substrate layer, and an array of pixels having organic light-emitting diodes on the thin-film transistor layer.

A flexible encapsulation layer may be used to encapsulate and protect the organic light-emitting diodes and thin-film transistor layer of the flexible display. The flexible encapsulation layer may include a lateral dispersion layer that exhibits an anisotropic moisture diffusion characteristic. Lateral diffusion in the lateral dispersion layer is larger than vertical dispersion in a direction that runs perpendicular to the display.

An inorganic conformal coating layer may coat the lateral diffusion (dispersion) layer and may serve as a pinhole filling layer (i.e., a layer that coats and smooths particles on the lateral dispersion layer). The pinhole filling layer may be deposited using atomic layer deposition. By coating and smoothing particles on the lateral diffusion (dispersion) layer, the particles will not damage the encapsulation layer.

The pinhole filling layer may be covered with a moisture barrier layer that serves to prevent moisture from penetrating the display. The moisture barrier layer may have one or more layers of material such as inorganic material that blocks moisture.

A polymer protective layer may cover the moisture barrier layer and may be relatively insensitive to bending induced stress as the display is flexed. Because the inorganic layers of the encapsulation layer are located below the polymer protective layer and are therefore subjected to reduced amounts of bending stress, bending-induced cracks in the inorganic layers can be reduced.

DETAILED DESCRIPTION

Figure 1:
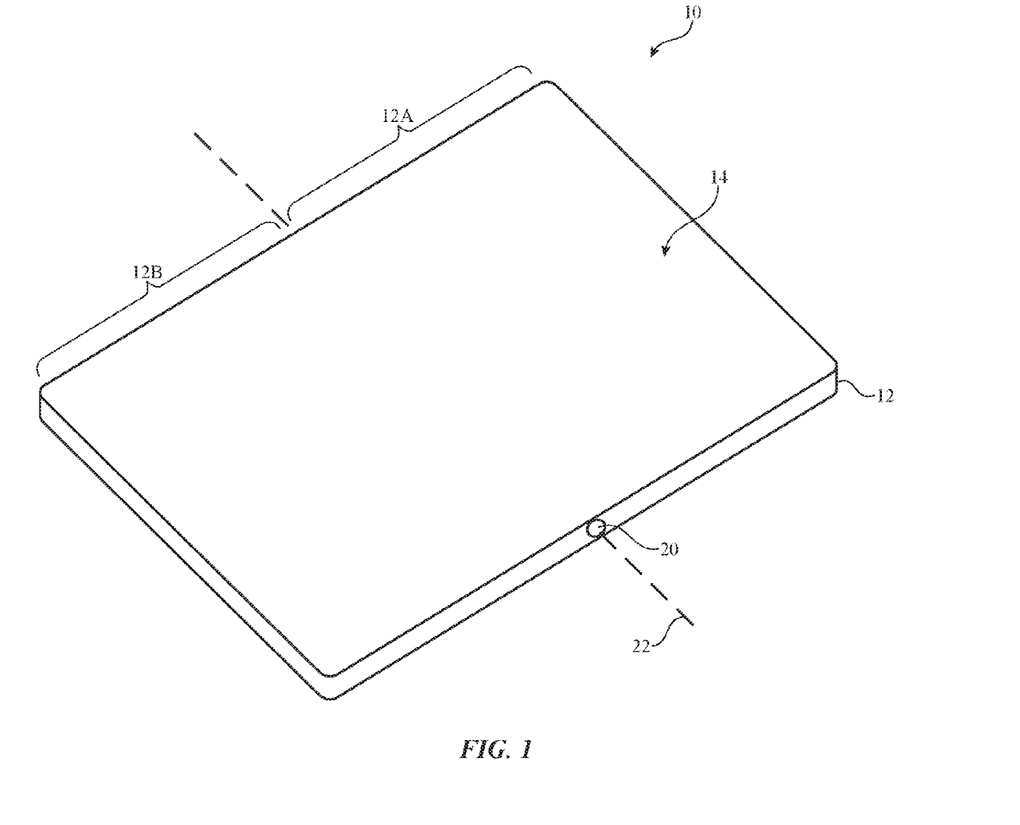
FIG. 1 is a perspective view of an illustrative electronic device having a display in accordance with an embodiment.

An illustrative electronic device of the type that may be provided with a flexible display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a wearable or miniature device of other types, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, microelectromechanical (MEMs) shutter pixels, electrowetting pixels, micro-light-emitting diodes (small crystalline semiconductor die), organic light-emitting diodes (e.g., a thin-film organic light-emitting diode display), or pixels based on other display technologies. Configurations in which display 14 is an organic light-emitting diode display are sometimes described herein as an example.

To accommodate bending of display 14, the substrate of display 14 and other layers that make up display 14 may be flexible. Housing 12 may have portions such as portions 12A and 12B that are coupled by hinge 20. Hinge 20 may allow portions 12A and 12B of housing 12 to rotate about bend axis 22 with respect to each other. In the example of FIG. 1, housing portions 12A and 12B have equal sizes, so bend axis 22 is located in the center of device 10. Configurations in which bend axis 22 overlaps other portions of flexible display 14 may also be used.

Figure 2:
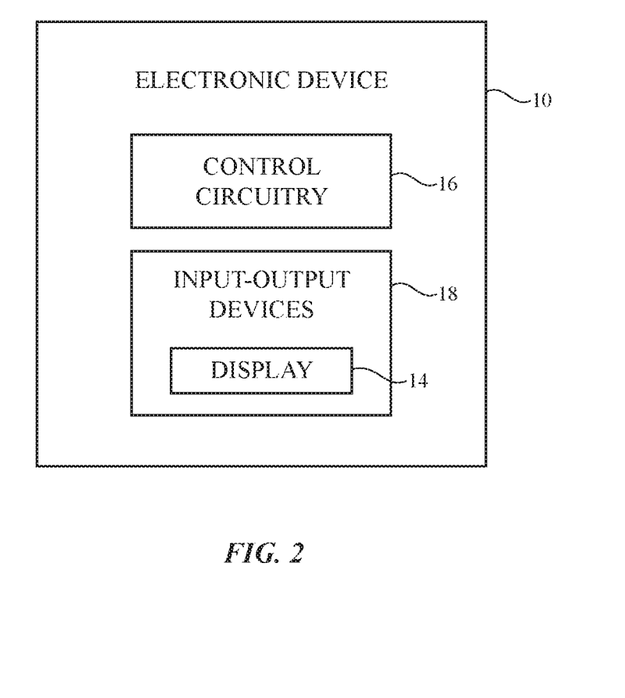
FIG. 2 is a schematic diagram of an illustrative electronic device having a display in accordance with an embodiment.

A schematic diagram of an illustrative electronic device such as device 10 of FIG. 1 is shown in FIG. 2. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include a display such as display 14 of FIG. 1.

Control circuitry 16 may be used to run software on device 10 such as operating system code and applications. During operation of device 10, the software running on control circuitry 16 may display images on display 14 (e.g., video, still images such as text, alphanumeric labels, photographs, icons, other graphics, etc.) using an array of pixels in display 14.

Figure 3:
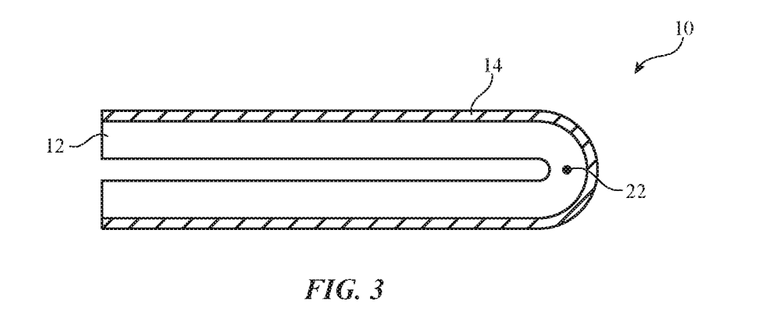
FIGS. 3 and 4 are cross-sectional side views of electronic devices with flexible displays in accordance with an embodiment.
Figure 4:
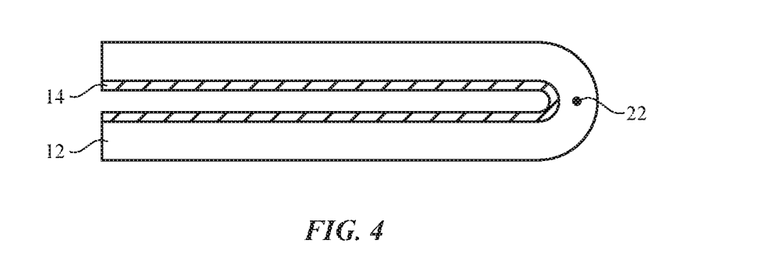

As shown in FIG. 3, device 10 may be folded (bent by 180° or other suitable amount) about bend axis 22 so that display 14 is visible from the outside of device 10 in its folded state. FIG. 4 shows how device 10 may be folded about bend axis 22 so that display 14 is protected within the interior of device 10. Device 10 may have hinges that allow outward bending of the type shown in FIG. 3, that allow inward bending of the type shown in FIG. 4, or that allow bending of both the type shown in FIG. 3 and the type shown in FIG. 4. Configurations in which device 10 is flexed by different amounts (e.g., more than 180° or less than 180°) may also be used.

Display 14 may have an outermost layer formed from flexible plastic or glass that serves as a protective layer underlying display structures. The outer display layer may sometimes be referred to as a display cover layer. In some configurations for display 14, the outermost layer of the display may serve both as a protective layer (display cover layer) and as a substrate for display structures (touch sensors electrodes, color filter elements, thin-film transistors, etc.). In other configurations, the display cover layer is free of circuitry and serves solely as a protective layer. In yet other configurations, the structures of display 14 may be protected using thin-film coatings.

Figure 5:
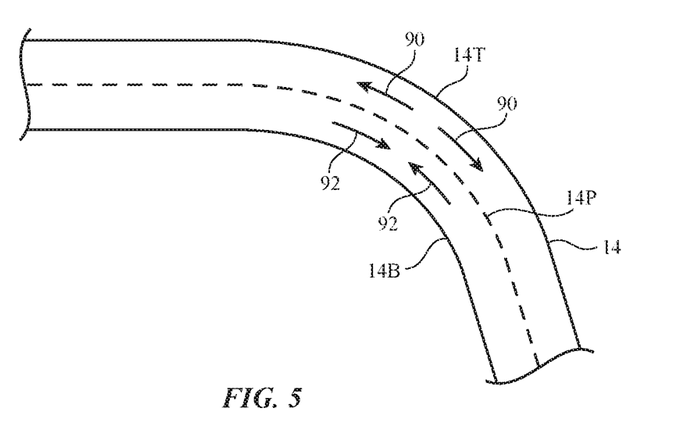
FIG. 5 is a cross-sectional side view of an illustrative flexible display in a bent configuration in accordance with an embodiment.

As shown in the cross-sectional side view of display 14 of FIG. 5, the process of bending display 14 about bend axis 22 has the potential to introduce stress into portions of display 14. Bending-induced stress will generally be at a minimum along neutral stress plane 14P. In the example of FIG. 5, the outer portions of display 14 such as one or more of the layers of display 14 adjacent to outer display surface 14T overlapping bend axis 22 will experience tensile stress, as indicated by arrows 90 and the inner portions of display 14 such as one or more of the layers of display 14 adjacent to inner display surface 14B will experience compressive stress, as indicated by arrows 92. To minimize damage to display 14 during bending, it may be desirable to locate sensitive display structures close to neutral stress plane 14P (e.g., away from surfaces 14B and 14T).

Figure 6:
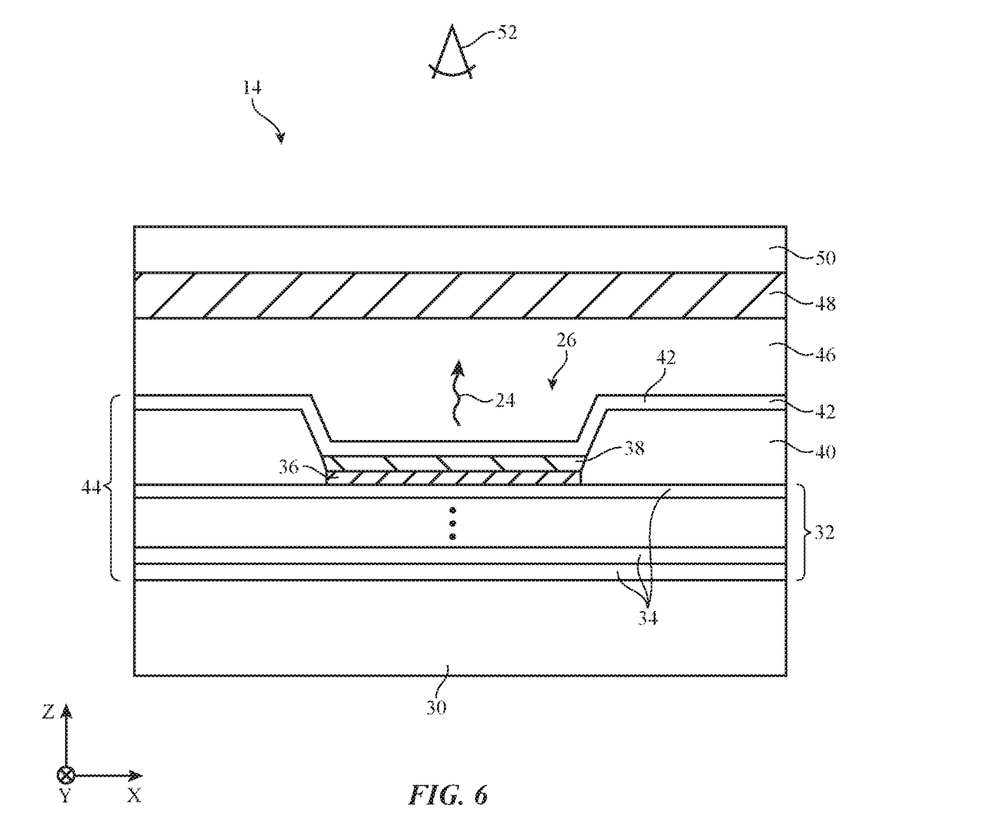
FIG. 6 is a cross-sectional side view of an illustrative display having thin-film transistor circuitry and an encapsulation layer in accordance with an embodiment.

A cross-sectional side view of organic light-emitting diode display 14 is shown in FIG. 6. As shown in FIG. 6, display 14 may include a substrate layer such as substrate layer 30. Substrate 30 may be a planar layer or a non-planar layer and may be formed from plastic, glass, ceramic, sapphire, or other suitable materials. Configurations for display 14 in which substrate 30 is formed from a flexible material such as plastic are sometimes described herein as an example.

Thin-film transistor circuitry 44 may be formed on substrate 30. Thin film transistor circuitry (thin film transistor layer) 44 may include anode structures such as anode 36 on layers 34. Layers 34 may include semiconductor layers, metal layers, and dielectric layers that form circuitry 32. Circuitry 32 may include transistors and capacitors for controlling light-emitting diodes such as light emitting diode 26 of FIG. 6. During operation, light-emitting diode 26 may emit light 24. Display 14 includes an array of pixels each of which has a respective light-emitting diode 26.

Light-emitting diode 26 of FIG. 6 may be formed within an opening in pixel definition layer 40. Pixel definition layer 40 may be formed from a patterned photoimageable polymer. In each light-emitting diode, organic emissive material 38 is interposed between a respective anode 36 and cathode 42. Anodes 36 may be patterned from a layer of metal on circuitry 32. Cathode 42 may be formed from a common conductive layer that is deposited on top of pixel definition layer 40. Cathode 42 is transparent so that light 24 may exit light emitting diode 26. The arrangement of FIG. 6 uses a common cathode and individual anodes, but an arrangement with a shared anode and individual cathodes may be used, if desired. The cathode may be on the top or bottom of emissive layer 38.

Organic light-emitting diode display structures such as emissive material 38 and other thin-film transistor circuitry 44 may be sensitive to moisture. Accordingly, thin-film transistor circuitry 44 may be covered with a layer of moisture barrier structures. For example, thin-film transistor circuitry 44 may be covered with a moisture barrier layer such as flexible encapsulation layer 46. Layer 46 may include organic and inorganic sublayers that serve as moisture barrier materials, planarization layers, adhesive layers, buffer layers, and other structures.

To help facilitate bending without damage due to compressive and/or tensile stress, the layers (sublayers) of material in encapsulation layer 46 that are more sensitive to stress (e.g., inorganic layers) may be located away from the outer surface of display 14 (i.e., at a minimum height Z with respect to viewer 52 and close to neutral stress plane 14P), whereas the layers (sublayers) of material that are less sensitive to stress (e.g., organic polymer layers) may be located adjacent to the outer surface of display 14 (i.e., at large "Z" values in the arrangement of FIG. 6).

Display 14 may have an optional protective outer display layer such as flexible transparent display cover layer 50. Layer 50 may be formed from flexible plastic, a flexible glass structure, or other flexible layer of material. If desired, layer 50 may have a thickness sufficient to help protect underlying layers in display 14 from damage such as scratches. For example, cover glass 50 may have a thickness of 0.05 to 2 mm, 0.1 to 0.5 mm, etc. In other configurations, display cover layer 50 may be omitted and protection provided for display 14 using thin-film coatings.

If desired, display 14 may include functional layers 48 between display cover layer 50 and encapsulation layer 46. Functional layers 48 may include a touch sensor layer, a circular polarizer layer, and other layers. A circular polarizer layer may help reduce light reflections from metal traces in thin-film transistor circuitry 44. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach display cover layer 50 and functional layers 48 to underlying display layers such as encapsulation layer 46, thin-film transistor circuitry 44, and substrate 30. If desired, the uppermost material in layer 46 may be formed from a polymer that serves both as a protective layer and as an adhesive to attach a touch sensor or other function layer 48 to encapsulation layer 46.

Figure 7:
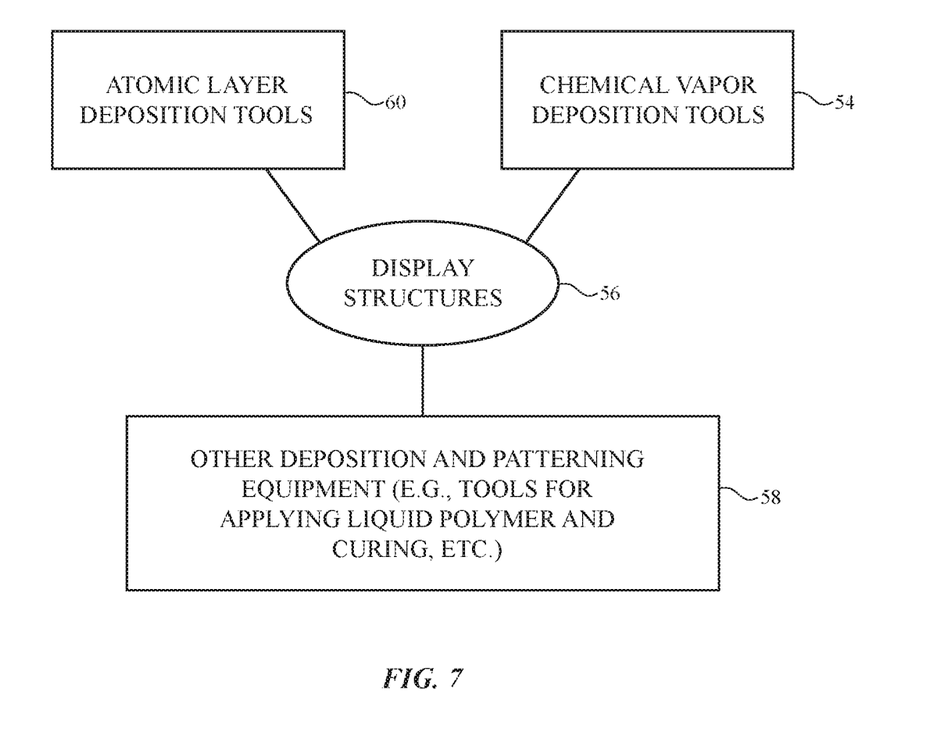
FIG. 7 is a diagram of illustrative fabrication tools of the type that may be used in forming a flexible display in accordance with an embodiment.

It may be desirable to use thin-film deposition techniques such as atomic layer deposition, chemical vapor deposition, and other techniques for forming display 14. For example, tools of the type shown in FIG. 7 may be used in forming layer 46 and/or the other layers of display 14 (shown as display structures 56 in FIG. 7). The tools of FIG. 7 may include atomic layer deposition tools 60. Atomic layer deposition tools 60 may deposit thin conformal coating layers by alternately exposing structures 56 to different chemical precursors that react with each other. Chemical vapor deposition tools 54 may include plasma enhanced chemical vapor deposition equipment and other chemical vapor deposition equipment. Tools 54 may deposit layers of material at a deposition rate that is typically larger than available through atomic layer deposition tools, but may produce coatings that are less conformal than the coatings produced by tools 60. If desired, additional material deposition and patterning tools 58 may be used in processing display structures 56. For example, tools 58 may include physical vapor deposition equipment (e.g., evaporation equipment and/or sputtering equipment), ink-jet printing equipment, equipment for depositing material by spraying, dripping, dipping, lamination, screen-printing, pad printing, slit coating, and other deposition techniques and/or may include photolithography tools, etching equipment, laser processing equipment, ovens and other heat sources, and other tools for curing deposited liquid adhesive layers and otherwise processing and patterning deposited layers.

Figure 8:
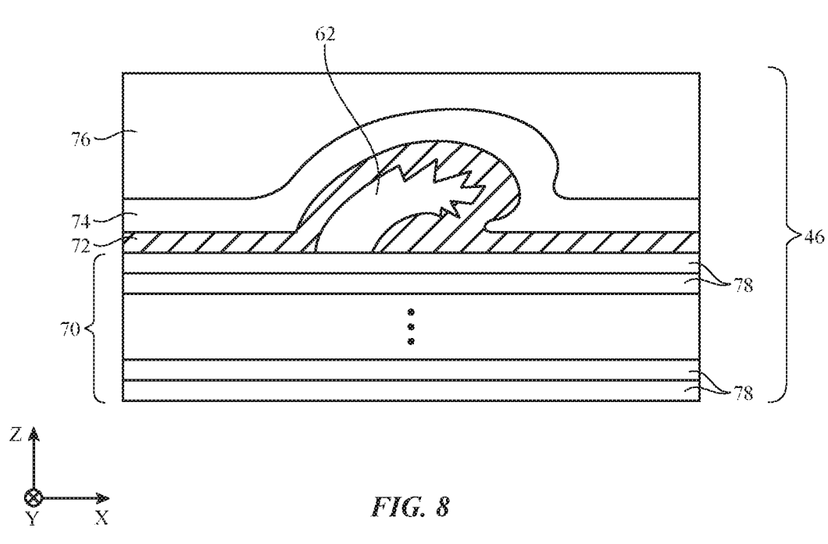
FIG. 8 is a cross-sectional side view of an illustrative flexible display encapsulation layer in accordance with an embodiment.

A cross-sectional side view of a layer of illustrative moisture barrier structures of the type that may be used in implementing layer 46 of FIG. 6 (i.e., a flexible encapsulation layer) is shown in FIG. 8. The layers of FIG. 8 may be deposited on organic light-emitting diode display layers such as organic light-emitting diode thin-film transistor circuitry 44 or a layer such as a polymer layer may be interposed between layer 44 and layer 46 of FIG. 8.

Encapsulation layer 46 may include layers of material such as layers 70, 72, 74, and 76. These layers may protect and encapsulate layer 44 and may therefore sometime be referred to as an encapsulation layer or encapsulation structures. Each of layers 70, 72, 74, and 76 may include one or more sublayers (e.g. one or more inorganic layers and/or one or more organic layers).

With one illustrative configuration for display 14, layer 70 may be a lateral dispersion layer that promotes lateral dispersion of moisture in the X-Y plane of FIG. 8 (i.e., parallel to the plane of display 14). Lateral dispersion layer 70 has anisotropic water diffusion characteristics. Water diffuses more rapidly in lateral dimensions X and Y than in vertical dimension Z. In the event that moisture penetrates through barrier layer materials above layer 70, the lateral dispersion characteristics of layer 70 will help to spread out the moisture and thereby avoid localized damage to display 14 and associated visible artifacts due to moisture damage (e.g., dark spots on display 14 may be avoided which might otherwise arise if drops of moisture penetrated to sensitive organic light-emitting diode structures such as emissive material 38, etc.).

Lateral dispersion layer 70 may contain a series of layers (see, e.g., layers 78 of FIG. 8). Layers 78 may include layers that are relatively impermeable to moisture such as silicon nitride ($SiN_x$) and layers that are relatively porous such as silicon oxycarbide (SiOC). The less permeable layers may alternate with the more permeable layers to form a stack of layer pairs. Each impermeable/permeable pair (sometimes referred to as a dyad) may include a first layer such as a silicon nitride layer that is characterized by a relatively low water vapor transmission rate (WVTR) of about $10^{-4}$ to $10^{-3}$ g/m$^2$/day or less. This first layer may serve to block moisture penetration inwardly in vertical dimension Z. Each impermeable/permeable pair may also include a second layer such as a silicon oxycarbide that is characterized by a relatively high water vapor transmission rate (e.g., a WVTR value of $10^{-1}$ g/m2/day or more). Because the WVTR value of the second layer is more than the first layer, the first layer tends to block progress of intruding moisture inwardly in the −Z dimension, whereas the second layer tends to encourage lateral diffusion of moisture in the X-Y plane. The total thickness of layer 70 may be in the range of 0.05 to 20 microns, may be 0.1 to 5 microns, may be 0.2 to 2 microns, may be less than 5 microns, may be more than 0.3 microns, or may be any other suitable thickness. In addition to forming layer 70 from a stack of alternating porous/non-porous layers, layer 70 may, if desired, be formed from a single inorganic layer.

The material of layer 70 may be organic or inorganic and may be formed in a single layer or multiple layers of material (e.g., a stack of porous/non-porous pairs). In the present example (silicon nitride for the non-porous layer and silicon oxycarbide for the porous layer), both the porous layer and the non-porous layer are inorganic. Configurations in which one of these layers is organic and one is inorganic or in which both layers are organic may also be used.

Materials that may be used for forming layers 78 include silicon nitride, silicon oxide, silicon oxycarbide, and siliconoxynitride. Layers 78 may be formed by chemical vapor deposition (e.g., plasma enhanced chemical vapor deposition), atomic layer deposition, sputtering, other deposition processes, or combinations of these processes.

Layer 70 may be covered with a pinhole filling layer such as layer 72. Particles on the surface of layer 70 such as particle 62 may have sharp protrusions. Layer 72 preferably is a thin conformal layer that is able to smooth out these protrusions and fill pinholes as shown in FIG. 8. This filling and smoothing process helps prevent particles such as particle 62 from breaking and therefore helps prevent subsequent damage due to particles such as particle 62. Layer 72 may be formed from a material such as a conformal coating material that is deposited using a conformal coating process such as atomic layer deposition. Layers of material deposited by atomic layer deposition may be characterized by good conformal coverage, may serve as a good barrier to oxygen and water permeation, may be free of pinholes, and may exhibit good adhesion with other layers. The total thickness of layer 72 may be about 0.05 microns to 5 microns. As an example, layer 72 may have a thickness of about 0.5 microns, 0.3 to 2 microns, 0.2 to 0.8 microns, more than 0.25 microns, less than 0.9 microns, less than 1 micron, or other suitable thickness.

Layer 72 may be an inorganic material such as aluminum oxide, silicon oxide, titanium oxide, or other suitable material. Layer 72 may be formed from a single layer of material or multiple layers of material. For example, layer 72 may be a single atomic layer deposition layer of aluminum oxide, a single atomic layer deposition layer of silicon oxide, or a single atomic layer deposition layer of titanium oxide. As another example, layer 72 may include a 1 micron layer of plasma-enhanced chemical vapor deposition silicon oxycarbide that is coated with a 0.5 micron atomic layer deposition layer of aluminum oxide. The 0.5 micron aluminum oxide layer (in this example) may be coated with a 1 micron coating of plasma-enhanced chemical vapor deposition silicon oxycarbide. Atomic layer deposition processes may be used to form some or all of layer 72 or other processes may be used in forming layer 72 (e.g., hybrid chemical vapor deposition and atomic layer deposition processes, plasma-enhanced chemical vapor deposition, etc.). Layer 72 may optionally be capped with a plasma-enhanced chemical vapor deposition silicon nitride layer or other inorganic layer.

Moisture barrier layer 74 may be deposited on top of pinhole filling layer 72. Moisture barrier layer 74 may be a conformal layer that serves as a barrier to moisture permeation and oxygen. Barrier layer 74 may be formed from a single layer or multiple layers. As an example, barrier layer 74 may be formed from a single layer of silicon nitride. Other materials may also be used in forming barrier layer 74 such as silicon oxide, silicon oxycarbide, silicon oxynitride, and aluminum oxide. Layer 74 may be deposited by plasma enhanced chemical vapor deposition, atomic layer deposition, sputtering, or other deposition processes. The total thickness of moisture barrier layer 74 may be about 0.5 to 20 microns. As an example, the thickness of layer 74 may be about 0.6 to 1.5 microns, 0.8 to 1.2 microns. 0.5 to 3 microns, less than 5 microns, more than 0.3 microns, or other suitable thickness. If desired, atomic layer deposition and chemical vapor deposition processes may be alternated to form a stack of layer pairs for layer 74. Each layer pair may include a silicon oxide atomic layer deposition layer of about 1 angstrom in thickness and a 10 angstrom silicon nitride chemical vapor deposition layer. Other multilayer configurations may also be used in forming barrier layer 74, if desired. The water vapor transmission rate of barrier layer 74 is preferably less than $10^{-4}$ g/m$^2$/day. Layer 74 may be insoluble in water.

To prevent damage to layers 70, 72, and 74, these layers are preferably coated with a protective organic layer such as particle fixing layer 76. Particle fixing layer 76 helps protects layer 46 from damage from physical impact. In particular, particle fixing layer 76 helps hold particles such as particle 62 in place when the surface of layer 46 is contacted by an external object during use. Layer 76 thereby assists layer 72 in prevent particles on the surface of layer 70 from breaking. In the absence of layers such as layers 72 and 74, particles such as particle 62 might break and cause damage to layers 70, 72, and 74. This damage might allow moisture to penetrate layers 70, 72, and 74. Layer 76 is located at larger distances along vertical dimension Z than layers 70, 72, and 74 (i.e., layer 76 is located farther from substrate 30 than layers 70, 72, and 74). Because layer 76 is located farther from neutral stress plane 14P, layer 76 may be subjected to more bending-induced stress than layers 70, 72, and 74. It may therefore be desirable to minimize or eliminate the use of stress-sensitive materials such as rigid inorganic materials in layer 76. Layer 76 may, as an example, be formed from a flexible elastomeric polymer such as silicone or other polymer that can stretch and bend (e.g., epoxy, polyethylene terephthalate, polyethylene naphthalate, etc.). Layer 76 may also be formed from inorganic layers that are resistant to stress-induced damage such as porous inorganic layers. Layer 76 preferably fixes the locations of particles such as particle 62, provides mechanical protection for display 14, and exhibits satisfactory adhesion to barrier layer 74. The thickness of layer 76 may be about 0.1 to 500 microns.

Figure 9:
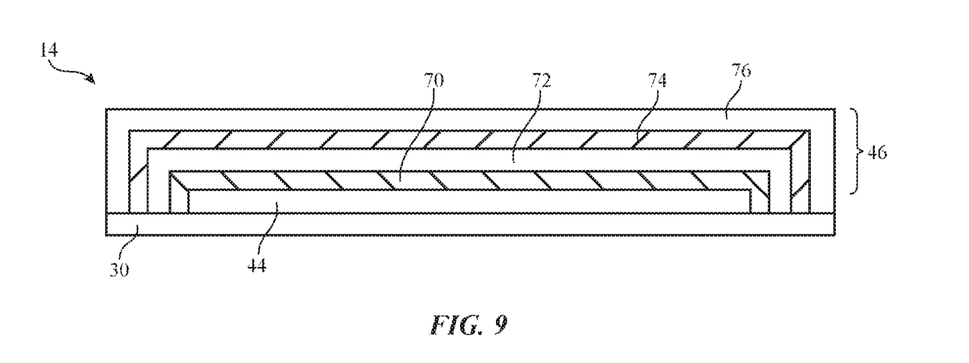
FIG. 9 is a cross-sectional side view of an illustrative display having encapsulation layer structures of the type shown in FIG. 8 in accordance with an embodiment.

By using layers such as layers 70, 72, 74, and 76 of FIG. 8 in a configuration for display 14 such as the configuration of FIG. 9, display 14 may exhibit a tight bend radius (e.g., a bend radius of 2-4 mm, of 2-3 mm, of less than 3 mm, less than 5 mm, more than 0.1 mm, or other suitable bend radius.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    a housing having portions that rotate relative to each other about a bend axis;
    a flexible display in the housing that includes a flexible substrate layer with an array of pixels that extend laterally across the flexible display and a flexible encapsulation layer covering the array of pixels, wherein the flexible encapsulation layer comprises:
    a lateral dispersion layer on the array of pixels that has more lateral moisture dispersion than vertical moisture dispersion;
    a pinhole filling layer on the lateral dispersion layer that is configured to coat and smooth particles on the lateral dispersion layer; and
    a moisture barrier layer on the pinhole filling layer.

2. The electronic device defined in claim 1 further comprising a particle fixing layer on the moisture barrier layer that is configured to prevent the particles from breaking.

3. The electronic device defined in claim 2 wherein the pinhole filling layer comprises an atomic layer deposition layer selected from the group consisting of: an aluminum oxide atomic layer deposition layer and a silicon oxide atomic layer deposition layer.

4. The electronic device defined in claim 3 wherein the moisture barrier layer comprises a layer of inorganic material.

5. The electronic device defined in claim 4 wherein the layer of inorganic material in the moisture barrier layer comprises a silicon nitride layer.

6. The electronic device defined in claim 5 wherein the particle fixing layer comprises an organic layer.

7. The electronic device defined in claim 6 wherein the organic layer of the particle fixing layer comprises a material selected from the group consisting of: silicone, epoxy, polyethylene terephthalate, and polyethylene naphthalate.

8. The electronic device defined in claim 7 wherein the lateral dispersion layer comprises a stack of inorganic layer pairs.

9. The electronic device defined in claim 8 wherein each inorganic layer pair includes a first layer and a second layer that is less porous than the first layer.

10. The electronic device defined in claim 9 wherein the first layer of each pair comprises silicon oxycarbide and wherein the second layer of each pair comprises silicon nitride.

11. The electronic device defined in claim 9 wherein the first layer has a water vapor transmission rate of at least 10-1 g/m2/day.

12. The electronic device defined in claim 11 wherein the second layer has a water vapor transmission rate of less than 10-1 g/m2/day.

13. The electronic device defined in claim 12 wherein the flexible display is an organic light-emitting diode display and wherein the pixels each include a corresponding organic light-emitting diode.

14. An organic light-emitting diode display, comprising:
a substrate;
a thin-film transistor layer on the substrate;
an array of organic light-emitting diodes on the thin-film transistor layer; and
a flexible encapsulation layer on the array of organic light-emitting diodes, wherein the flexible encapsulation layer comprises a lateral dispersion layer exhibiting an anisotropic moisture diffusion characteristic, an inorganic conformal coating layer on the lateral dispersion layer, a moisture barrier layer on the inorganic conformal coating layer, and a polymer protective layer on the moisture barrier layer, and wherein the lateral dispersion layer comprises a plurality of porous layers alternated with non-porous layers.

15. The organic light-emitting diode display defined in claim 14 wherein the inorganic conformal coating layer comprises an atomic layer deposition layer.

16. The organic light-emitting diode display defined in claim 15 wherein the atomic layer deposition layer comprises a material selected from the group consisting of aluminum oxide and silicon oxide.

17. The organic light-emitting diode display defined in claim 14 wherein the moisture barrier layer comprises a layer of silicon nitride.

18. An organic light-emitting diode display, comprising:
a polymer substrate;
thin-film transistor circuitry on the polymer substrate; and
an array of light-emitting diodes on the thin-film transistor circuitry;
a stack of inorganic layer pairs and that is configured to coat and smooth particles on the stack of inorganic layer pairs each including a first inorganic layer and a second inorganic layer that has a lower water vapor transfer rate than the first inorganic layer;
an inorganic atomic layer deposition conformal coating layer that covers the stack of inorganic layer pairs;
an inorganic moisture barrier layer that covers the inorganic atomic layer deposition conformal coating and that includes at least one silicon nitride layer; and
a polymer protective coating layer on the inorganic moisture barrier layer.

19. The organic light-emitting diode display defined in claim 18 wherein the inorganic atomic layer deposition conformal coating layer has a thickness of 0.2 microns to 0.8 microns.

* * * * *